US011711030B2

(12) United States Patent
Ishii et al.

(10) Patent No.: US 11,711,030 B2
(45) Date of Patent: Jul. 25, 2023

(54) DRIVING DEVICE, TACTILE SENSATION PROVIDING APPARATUS, AND DRIVING METHOD

(71) Applicant: TAIYO YUDEN CO., LTD., Tokyo (JP)

(72) Inventors: Shigeo Ishii, Takasaki (JP); Sumiaki Kishimoto, Takasaki (JP); Hiroyuki Shimizu, Takasaki (JP); Takayuki Goto, Takasaki (JP); Yuichi Namikawa, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 194 days.

(21) Appl. No.: 17/207,241

(22) Filed: Mar. 19, 2021

(65) Prior Publication Data

US 2021/0376771 A1    Dec. 2, 2021

(30) Foreign Application Priority Data

May 27, 2020  (JP) .................................. 2020-092247
Aug. 31, 2020  (JP) .................................. 2020-145911

(51) Int. Cl.
*H02N 2/00*    (2006.01)
*G06F 3/01*    (2006.01)

(52) U.S. Cl.
CPC ............. *H02N 2/001* (2013.01); *G06F 3/016* (2013.01); *H02N 2/008* (2013.01)

(58) Field of Classification Search
CPC ......... H02N 2/001; H02N 2/008; G06F 3/016
See application file for complete search history.

(56) References Cited

U.S. PATENT DOCUMENTS

| 7,724,355 | B1 * | 5/2010 | McIntosh | G06F 3/043 356/28 |
| 8,766,953 | B1 * | 7/2014 | Cheatham, III | G06F 3/0436 310/317 |
| 10,897,713 | B2 * | 1/2021 | Palti | H04W 12/08 |
| 10,916,107 | B1 * | 2/2021 | Urzhumov | G08B 6/00 |
| 2010/0275934 | A1 * | 11/2010 | Keren | G01D 5/2066 324/228 |
| 2012/0327006 | A1 * | 12/2012 | Israr | G06F 3/0443 345/173 |
| 2014/0071071 | A1 * | 3/2014 | Hirose | G06F 3/016 345/173 |

(Continued)

FOREIGN PATENT DOCUMENTS

JP    H08314369 A    11/1996

*Primary Examiner* — Tadesse Hailu
(74) *Attorney, Agent, or Firm* — Law Office of Katsuhiro Arai

(57) ABSTRACT

A driving device generates a driving signal and outputs the driving signal to a piezoelectric element, the driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave.

12 Claims, 13 Drawing Sheets

(56) References Cited

U.S. PATENT DOCUMENTS

| | | | |
|---|---|---|---|
| 2014/0269208 A1* | 9/2014 | Baym | G10K 11/26 |
| | | | 367/138 |
| 2015/0002477 A1* | 1/2015 | Cheatham, III | G06F 3/016 |
| | | | 345/177 |
| 2017/0246481 A1* | 8/2017 | Mishelevich | A61N 2/006 |
| 2017/0308171 A1* | 10/2017 | Kamata | G06F 3/016 |
| 2017/0331563 A1* | 11/2017 | Tyler | A61B 5/165 |
| 2018/0151035 A1* | 5/2018 | Maalouf | G08B 6/00 |
| 2021/0162457 A1* | 6/2021 | Ebefors | G10K 15/00 |
| 2022/0266063 A1* | 8/2022 | Emery | A61B 8/4477 |

\* cited by examiner

DRIVING DEVICE, TACTILE SENSATION PROVIDING APPARATUS, AND DRIVING METHOD

BACKGROUND ART

The present disclosure relates to a driving device of a spatial vibration generating device, a tactile sensation providing apparatus, and a driving method, by which a tactile sensation is generated in a space using ultrasonic vibrations.

Various actuators are used in tactile function devices that provide tactile sensations to users. For example, an electromagnetic actuator such as an eccentric motor or a linear resonant actuator is used for a notification function. Moreover, in addition to these electromagnetic actuators, piezoelectric actuators are also used for a force feedback function.

In recent years, the tactile sensation technology has been advanced, and a technology by which tactile sensations such as a "rough" texture and a "smooth" texture can also be provided has been developed (e.g., see Japanese Patent Application Laid-open No. Hei 08-314369). Moreover, the three-dimensional tactile sensation technology that provides a tactile sensation in a space in addition to providing a tactile sensation on a plane has also been developed. The three-dimensional tactile sensation technology provides, for example, a tactile sensation in a space, in which a sound wave focusing technique and an ultrasonic levitation technique are applied, using a planar speaker including many transducers (ultrasonic vibrating members).

SUMMARY OF THE INVENTION

However, while the tactile sensation providing technology as described in Japanese Patent Application Laid-open No. Hei 08-314369 provides a tactile sensation by causing vibrations to an object touched by a user, the three-dimensional tactile sensation technology provides a tactile sensation by using ultrasonic waves in a space, in which the user does not touch the object. Thus, the three-dimensional tactile sensation technology is expected to provide a more realistic tactile sensation as if a user were actually touching the object. In addition, many transducers are used to output ultrasonic waves for providing a tactile sensation, which causes problems such as power consumption thereof and noise generation.

In view of the circumstances as described above, it is desirable to provide a driving device of a spatial vibration generating device, a tactile sensation providing apparatus, and a driving method, which are capable of providing a realistic tactile sensation.

In order to achieve the above object, according to an embodiment of the present disclosure, there is provided a driving device that generates a driving signal and outputs the driving signal to a piezoelectric element, the driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave.

With this configuration, the first low-frequency wave, which is the first modulated wave, has a frequency of 1 Hz or more and less than 100 Hz and can be easily sensed by Meissner's corpuscles and the like, which are receptors in human skin. Additionally, the second low-frequency wave, which is amplitude-modulated with the first modulated wave, has a frequency of 100 Hz or more and 300 Hz or less and can be easily sensed by Pacinian corpuscles and the like, which are receptors in human skin. Thus, modulating the high-frequency wave having a frequency of 20 kHz or more and 100 kHz or less, which is a carrier wave, with the second modulated wave generated by the above-mentioned amplitude modulation makes it possible for a user to obtain a real tactile sensation that has not been achieved so far.

The modulation of the high-frequency wave with the second modulated wave may include an amplitude modulation.

The modulation of the high-frequency wave with the second modulated wave may include a frequency modulation.

A ratio of the frequency of the second low-frequency wave to the frequency of the first low-frequency wave may be 100, 10, 5, 4, or 2.

In order to achieve the above object, according to another embodiment of the present disclosure, there is provided a tactile sensation providing apparatus including a spatial vibration generating device and a driving device.

The spatial vibration generating device includes transducers each including a piezoelectric element and arranged to cause ultrasonic waves to converge to a point in a space.

The driving device generates a driving signal and outputs the driving signal to the piezoelectric element, the driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave.

In order to achieve the above object, according to another embodiment of the present disclosure, there is provided a tactile sensation providing apparatus including a vibration generating device and a driving device.

The vibration generating device includes a vibrating member, and a piezoelectric element bonded to the vibrating member.

The driving device generates a driving signal and outputs the driving signal to the piezoelectric element, the driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave.

In order to achieve the above object, according to another embodiment of the present disclosure, there is provided a driving method including: generating a driving signal, the driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave; and outputting the driving signal to a piezoelectric element.

As described above, according to the present disclosure, it is possible to provide a driving device of a spatial vibration generating device, a tactile sensation providing apparatus, and a driving method, which are capable of providing a realistic tactile sensation.

These and other objects, features and advantages of the present disclosure will become more apparent in light of the following detailed description of embodiments thereof, as illustrated in the accompanying drawings. It is to be understood that both the foregoing general description and the following detailed description are exemplary and explanatory, and are intended to provide further explanation of the disclosure as claimed.

DETAILED DESCRIPTION OF THE EMBODIMENTS

A tactile sensation providing apparatus according to an embodiment of the present disclosure will be described.

[Configuration of Tactile Sensation Providing Apparatus]

Figure 1:
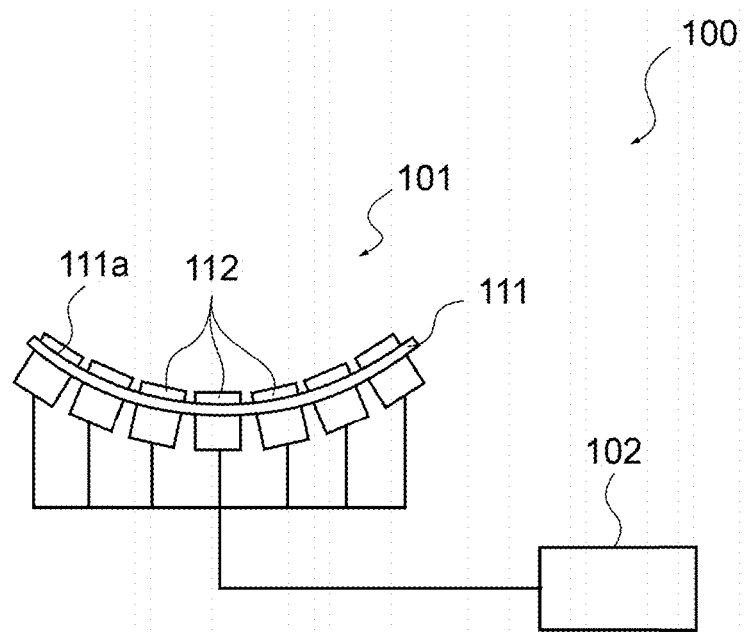
FIG. 1 is a schematic diagram of a tactile sensation providing apparatus according to an embodiment of the present disclosure.

FIG. 1 is a schematic diagram of a tactile sensation providing apparatus 100 according to this embodiment. As shown in the figure, the tactile sensation providing apparatus 100 includes a spatial vibration generating device 101 and a driving device 102.

The spatial vibration generating device 101 includes a support 111 and a plurality of transducers (ultrasonic vibrating members) 112. The support 111 has a curved surface 111a having a parabolic shape. The transducers 112 each have a configuration in which a piezoelectric element is bonded to a vibrating member, and generate ultrasonic waves. The transducers 112 are arranged on the curved surface 111a.

The driving device 102 supplies a driving signal to each transducer 112. Specifically, the driving device 102 is connected to the positive and negative electrodes of the piezoelectric elements provided in the respective transducers 112 and outputs a driving signal waveform, which will be described later, between the positive and negative electrodes. The driving device 102 is, for example, an amplifier.

Figure 2:
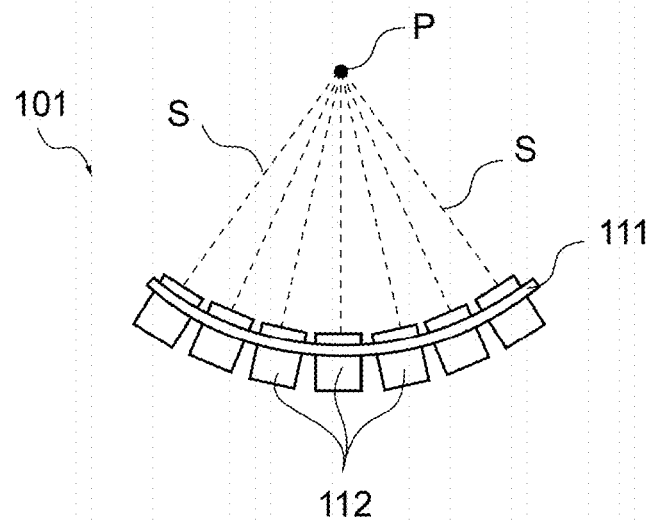
FIG. 2 is a schematic diagram showing the operation of a spatial vibration generating device of the tactile sensation providing apparatus.

FIG. 2 is a schematic diagram showing the operation of the spatial vibration generating device 101. When a driving signal is supplied from the driving device 102 to each transducer 112, an ultrasonic wave S is emitted from each transducer 112. Since the transducers 112 are arranged on the curved surface 111a, the ultrasonic waves S emitted from the respective transducers 112 converge to a point P in the space. When the user holds a finger over this point P, the user can feel a tactile sensation due to the ultrasonic waves S.

The tactile sensation providing apparatus 100 has the configuration as described above. Note that the configuration of the spatial vibration generating device 101 is not limited to the above-mentioned one and only needs to be capable of causing the ultrasonic waves to converge to a specific point in the space.

[Driving Signal Waveform]

The voltage waveforms of the driving signals output from the driving device 102 to the transducers 112 (hereinafter, referred to as driving signal waves) will be described. Note that a sine wave is used as the waveform of each signal for the sake of convenience in the following description, though not limited thereto.

<Amplitude Modulation and Frequency Modulation>

The driving device 102 is capable of using amplitude modulation and frequency modulation in order to generate the driving signal waves.

Figure 3A:
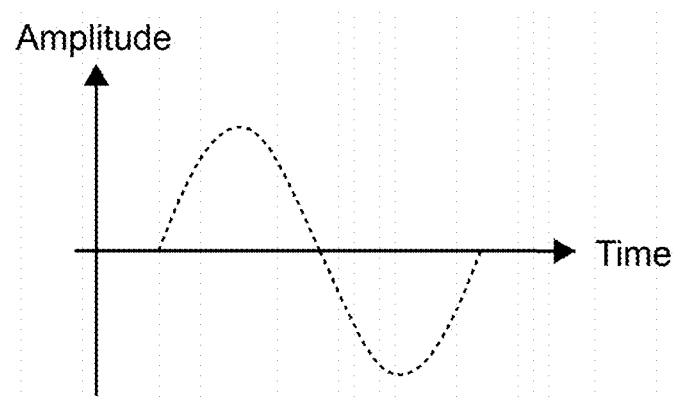
FIGS. 3A, 3B, and 3C are schematic diagrams showing the principle of amplitude modulation.
Figure 3B:
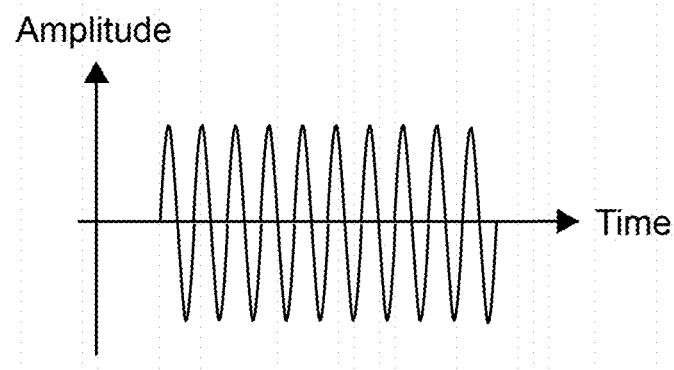
Figure 3C:
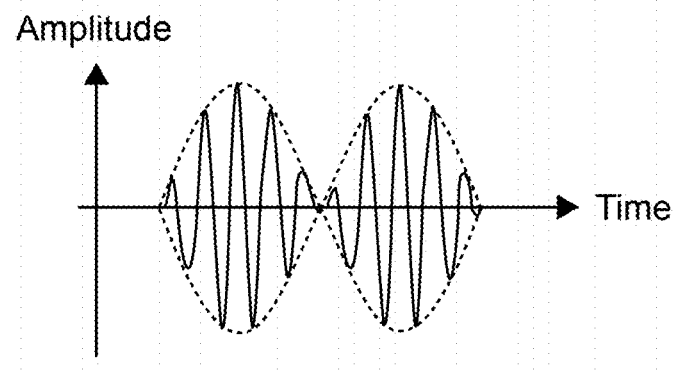

The amplitude modulation (AM) is a modulation method using the amplitude of a carrier wave. FIGS. 3A, 3B, and 3C are schematic diagrams showing the principle of the amplitude modulation. FIG. 3A shows the waveform of a signal to be transmitted (hereinafter, referred to as signal wave), and FIG. 3B shows a carrier wave used for transmission. In the amplitude modulation, the waveform of the signal wave is transmitted according to the intensity of the carrier wave in the amplitude direction as shown in FIG. 3C. The amplitude modulation has the advantages of a simple circuit configuration of a transmitter or receiver, of being capable of miniaturization and cost reduction, and of small power consumption. On the other hand, the amplitude modulation has the disadvantages of being vulnerable to noise and of difficulty to obtain high sound quality.

Figure 4:
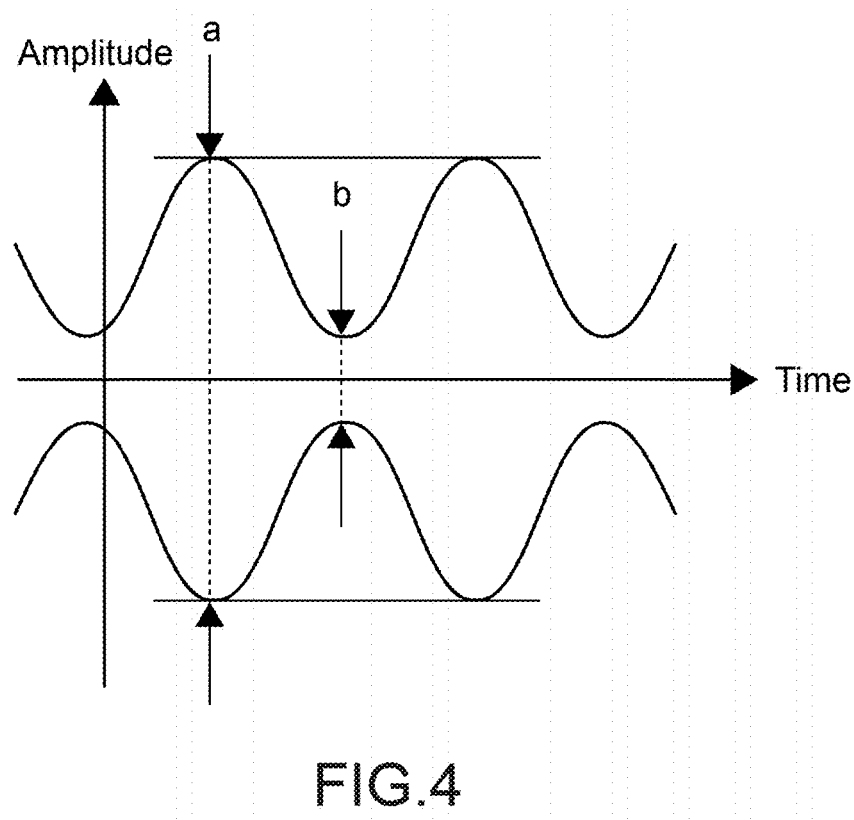
FIG. 4 is a schematic diagram showing the degree of modulation in amplitude modulation.

FIG. 4 is a schematic diagram showing a relationship between the waveform of the amplitude-modulated wave and the degree of modulation. As shown in the figure, assuming that the amplitude of the "peak" of the amplitude-modulated wave is represented as an amplitude "a" and the amplitude of the "valley bottom" is represented as an amplitude "b", the degree of modulation "m" is expressed by the following Equation 1. As shown in the following Equation 1, as the amplitude "b" becomes lower relative to the amplitude "a", the degree of modulation "m" becomes higher.

$$m=(a-b)/(a+b) \qquad \text{(Equation 1)}$$

Figure 5A:
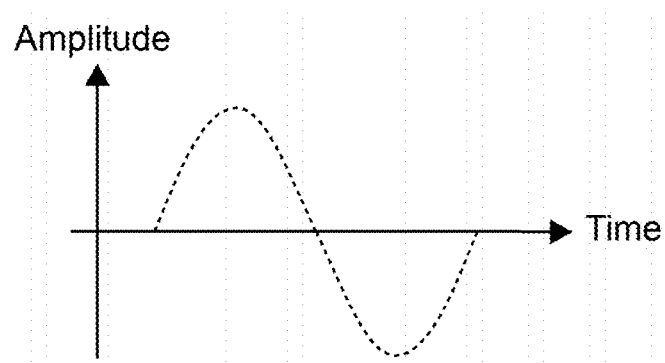
FIGS. 5A, 5B, and 5C are schematic diagrams showing the principle of frequency modulation.
Figure 5B:
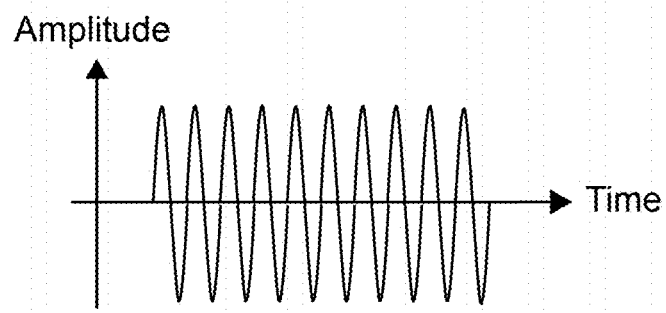
Figure 5C:
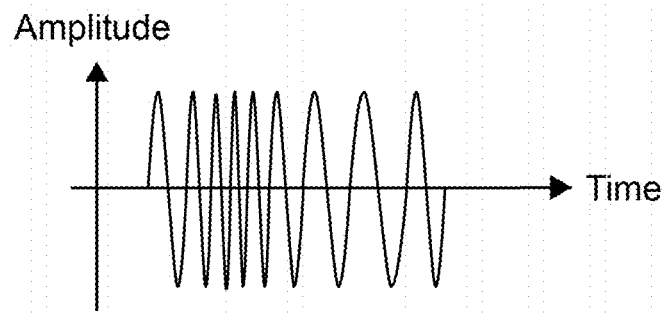

The frequency modulation (FM) is a modulation method using the frequency of the carrier wave. FIGS. 5A, 5B, and 5C are schematic diagrams showing the principle of the frequency modulation. FIG. 5A shows the waveform of a signal to be transmitted (hereinafter, referred to as signal wave), and FIG. 5B shows a carrier wave used for transmission. In the frequency modulation, the waveform of the signal wave is transmitted according to the change in frequency of the carrier wave as shown in FIG. 5C. The frequency modulation has the advantages of being resistant to noise and of capable of enhancing the quality of the transmitted signal. On the other hand, the frequency modulation has the disadvantages of being used only at a high frequency and of high circuit cost.

<First Modulated Wave and Second Modulated Wave>

The driving device 102 generates a first modulated wave and a second modulated wave from a first low-frequency wave and a second low-frequency wave. The first low-frequency wave is a sine wave having a frequency of 1 Hz or more and less than 100 Hz. The second low-frequency wave is a sine wave having a frequency of 100 Hz or more and 300 Hz or less.

Figure 6:
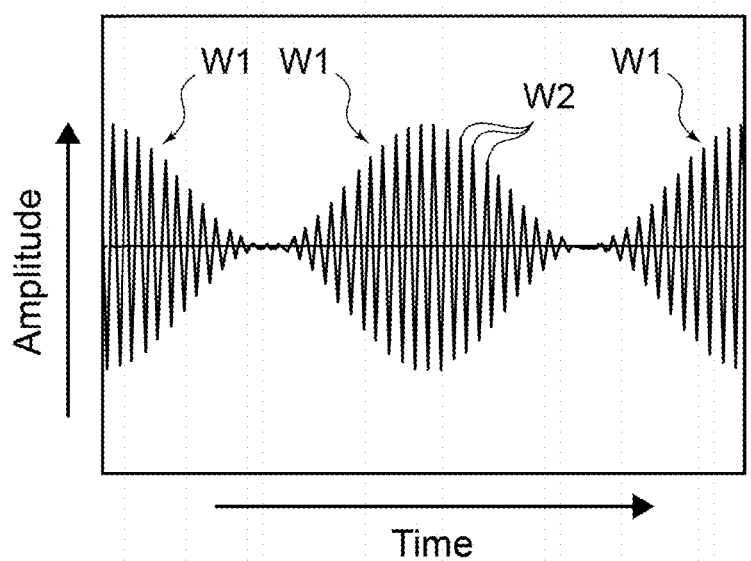
FIG. 6 is a schematic diagram showing a waveform of a second modulated wave (250 Hz+10 Hz) generated by a driving device of the tactile sensation providing apparatus.
Figure 7:
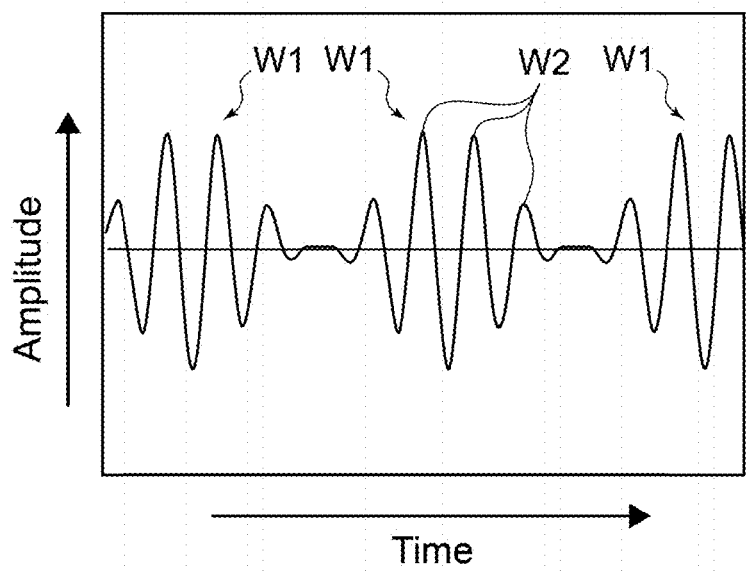
FIG. 7 is a schematic diagram showing a waveform of a second modulated wave (250 Hz+50 Hz) generated by the driving device of the tactile sensation providing apparatus.

The driving device 102 uses the first low-frequency wave as a first modulated wave to modulate the amplitude of the second low-frequency wave with the first modulated wave, thus generating a second modulated wave. FIG. 6 shows an example of the second modulated wave, which has a waveform obtained by modulating the amplitude of the second low-frequency wave having a frequency of 250 Hz with the first low-frequency wave having a frequency of 10 Hz. FIG. 7 shows another example of the second modulated wave, which has a waveform obtained by modulating the amplitude of the second low-frequency wave having a frequency of 250 Hz with the first low-frequency wave having a frequency of 50 Hz.

In FIGS. 6 and 7, a wave having a smaller wavelength, which is indicated by W2, is the amplitude-modulated second low-frequency wave, and a wave having a larger wavelength, which is indicated by W1, is the first low-frequency wave formed by the change in amplitude of the second low-frequency wave W2. In other words, the second modulated waves shown in FIGS. 6 and 7 are amplitude-modulated waves in which the second low-frequency wave W2 is a carrier wave and the first low-frequency wave W1 is a modulated wave. As the degree of modulation in the amplitude modulation (see FIG. 4) becomes closer to 100%, power consumption can be reduced more, and the sensitivity of the tactile sensation to be described later can be improved more by the amplitude drop, which is favorable.

<Driving Signal Wave>

Further, the driving device 102 generates a driving signal wave from a high-frequency wave and the second modulated wave. The high-frequency wave is a sine wave having a frequency of 20 kHz or more and 100 kHz or less and can be, for example, a sine wave having a frequency of 40 kHz. The driving device 102 modulates the high-frequency wave with the second modulated wave to generate a driving signal wave. This modulation can be amplitude modulation or frequency modulation.

Generation of Driving Signal Wave by Amplitude Modulation

Figure 8:
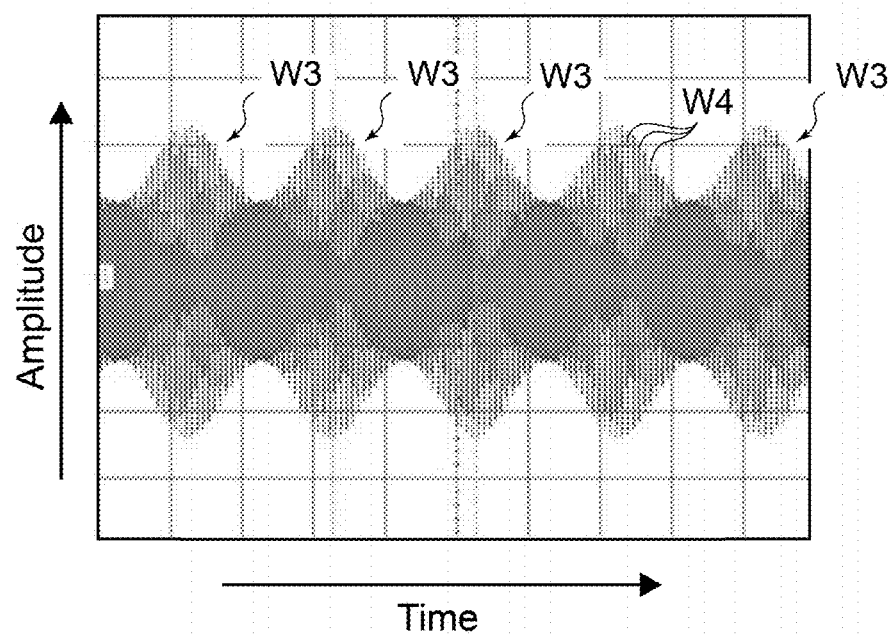
FIG. 8 is a schematic diagram showing a waveform of an amplitude-modulated driving signal wave (40 kHz+250 Hz+10 Hz) generated by the driving device of the tactile sensation providing apparatus.

The driving device 102 is capable of modulating the amplitude of the high-frequency wave with the second modulated wave to generate a driving signal wave. FIG. 8 shows an example of the driving signal wave subjected to the amplitude modulation, which has a waveform obtained by modulating the amplitude of the high-frequency wave having a frequency of 40 kHz with the second modulated wave. The second modulated wave has the above-mentioned waveform (see FIG. 6) obtained by modulating the amplitude of the second low-frequency wave having a frequency of 250 Hz with the first low-frequency wave having a frequency of 10 Hz.

Figure 9:
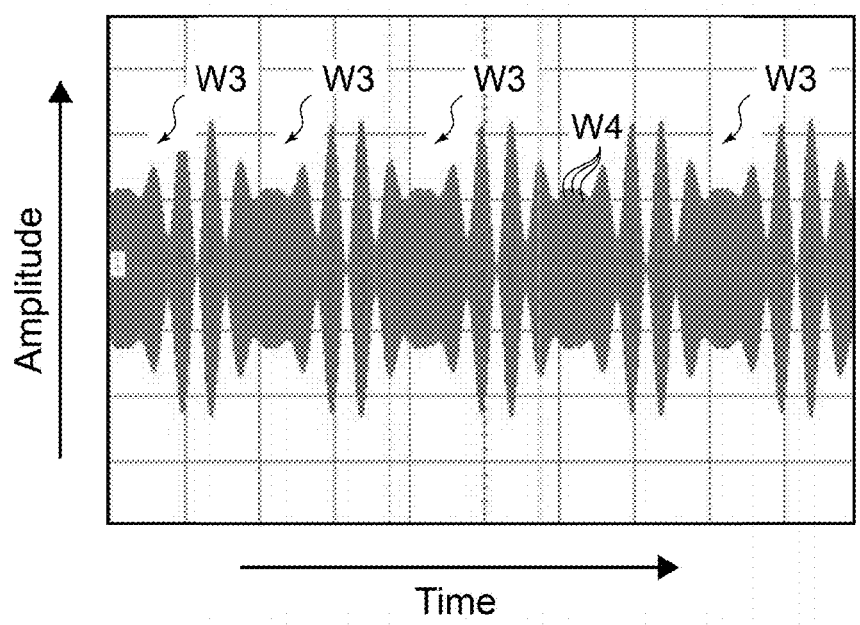
FIG. 9 is a schematic diagram showing a waveform of an amplitude-modulated driving signal wave (40 kHz+250 Hz+50 Hz) generated by the driving device of the tactile sensation providing apparatus.

FIG. 9 shows another example of the driving signal wave subjected to the amplitude modulation, which has a waveform obtained by modulating the amplitude of the high-frequency wave having a frequency of 40 kHz with the second modulated wave. The second modulated wave has the above-mentioned waveform (see FIG. 7) obtained by modulating the amplitude of the second low-frequency wave having a frequency of 250 Hz with the first low-frequency wave having a frequency of 50 Hz.

In FIGS. 8 and 9, a wave having a smaller wavelength, which is indicated by W4, is the amplitude-modulated high-frequency wave, and a wave having a larger wavelength, which is indicated by W3, is the second low-frequency wave formed by the change in amplitude of the high-frequency wave W4. In other words, the driving signal waves shown in FIGS. 8 and 9 are amplitude-modulated waves in which the high-frequency wave W4 is a carrier wave and the second low-frequency wave W3 is a modulated wave.

Generation of Driving Signal Wave by Frequency Modulation

Figure 10A:
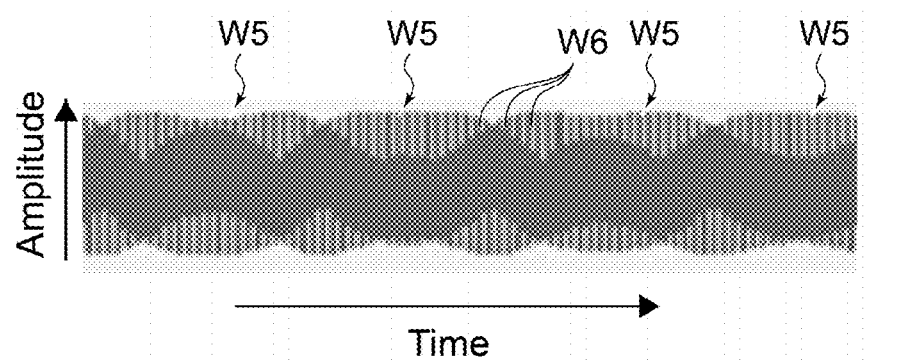
FIGS. 10A and 10B are schematic diagrams showing a waveform of a frequency-modulated driving signal wave (40 kHz+250 Hz+10 Hz) generated by the driving device of the tactile sensation providing apparatus.
Figure 10B:
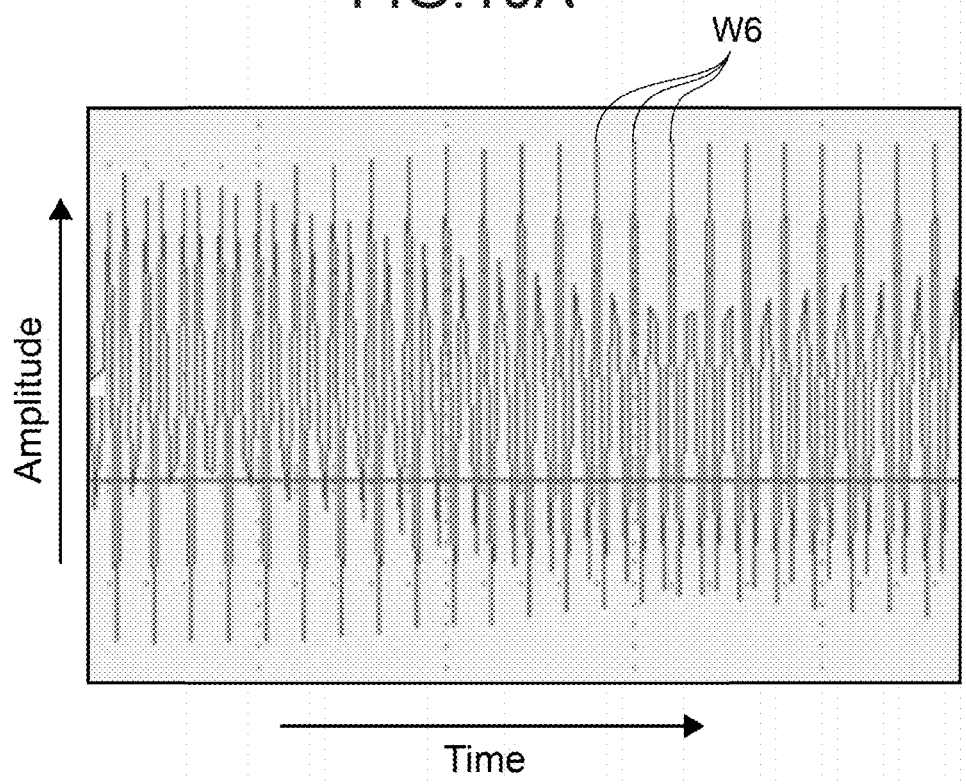

The driving device 102 is capable of modulating the frequency of the high-frequency wave with the second modulated wave to generate a driving signal wave. FIGS. 10A and 10B show an example of the driving signal wave subjected to the frequency modulation, which has a waveform obtained by modulating the frequency of the high-frequency wave having a frequency of 40 kHz with the second modulated wave. FIG. 10B is an enlarged view of FIG. 10A. The second modulated wave has the above-mentioned waveform (see FIG. 6) obtained by modulating the amplitude of the second low-frequency wave having a frequency of 250 Hz with the first low-frequency wave having a frequency of 10 Hz.

Figure 11A:
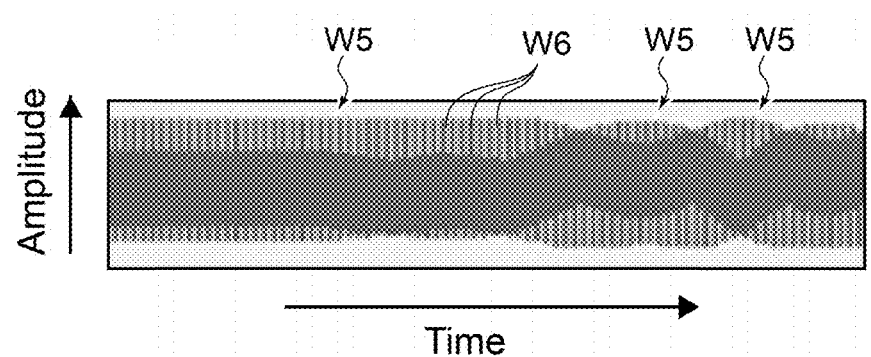
FIGS. 11A and 11B are schematic diagrams showing a waveform of a frequency-modulated driving signal wave (40 kHz+250 Hz+50 Hz) generated by the driving device of the tactile sensation providing apparatus.
Figure 11B:
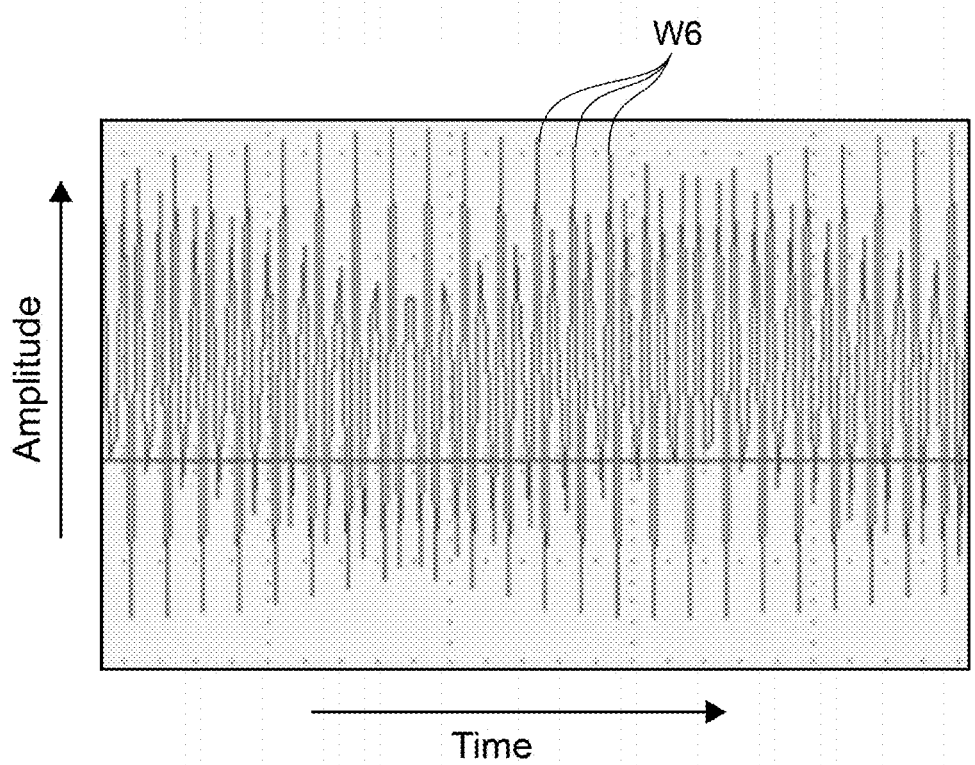

FIGS. 11A and 11B show another example of the driving signal wave subjected to the frequency modulation, which has a waveform obtained by modulating the frequency of the high-frequency wave having a frequency of 40 kHz with the second modulated wave. FIG. 11B is an enlarged view of FIG. 11A. The second modulated wave has the above-mentioned waveform (see FIG. 7) obtained by modulating the amplitude of the second low-frequency wave having a frequency of 250 Hz with the first low-frequency wave having a frequency of 50 Hz.

In FIGS. 10A to 11B, a wave having a smaller wavelength, which is indicated by W6, is the frequency-modulated high-frequency wave, and a wave having a larger wavelength, which is indicated by W5, is the second low-frequency wave formed by the change in frequency of the high-frequency wave W6. In other words, the driving signal waves shown in FIGS. 10A to 11B are frequency-modulated waves in which the high-frequency wave W6 is a carrier wave and the second low-frequency wave W5 is a modulated wave.

The driving device 102 generates a driving signal wave as described above. The driving device 102 may supply the driving signal wave generated by the amplitude modulation to the spatial vibration generating device 101, or may supply the driving signal wave generated by the frequency modulation to the spatial vibration generating device 101. The driving device 102 may be capable of generating only one of these driving signal waves or may be capable of generating both of them.

[Effect by Tactile Sensation Providing Apparatus]

The driving device 102 supplies the generated driving signal wave between the positive and negative electrodes in the piezoelectric element of each transducer 112 provided in the spatial vibration generating device 101. The transducers 112 generate ultrasonic waves in response to the driving signal waves and cause the ultrasonic waves to converge to a point P (see FIG. 2) in a space.

As described above, the driving signal wave is generated by using, as the second modulated wave, the waveform formed by modulating the amplitude of the second low-frequency wave with the first modulated wave, and then modulating the amplitude or frequency of the high-frequency wave with the second modulated wave. Here, the first low-frequency wave, which is the first modulated wave, is a sine wave having a frequency of 1 Hz or more and less than 100 Hz. This frequency is a frequency that can be easily sensed by Meissner's corpuscles and the like, which are receptors in human skin.

In addition, the second low-frequency wave, which is amplitude-modulated with the first modulated wave, is a sine wave having a frequency of 100 Hz or more and 300 Hz or less. This frequency is a frequency that can be easily sensed by Pacinian corpuscles and the like, which are receptors in human skin. Thus, modulating the high-frequency wave having a frequency of 20 kHz or more and 100 kHz or less, which is a carrier wave, with the second modulated wave generated by the amplitude modulation makes it possible for the user touching the point P to feel a clear tactile sensation.

Note that, as described above, the modulation of the high-frequency wave may be amplitude modulation or may be frequency modulation. The amplitude modulation can reduce the cost and power consumption of the signal processing circuit. On the other hand, the frequency modulation is resistant to noise and makes it possible for the user to feel heat in addition to a tactile sensation.

[Configuration of Vibration Generating Device]

Figure 12:
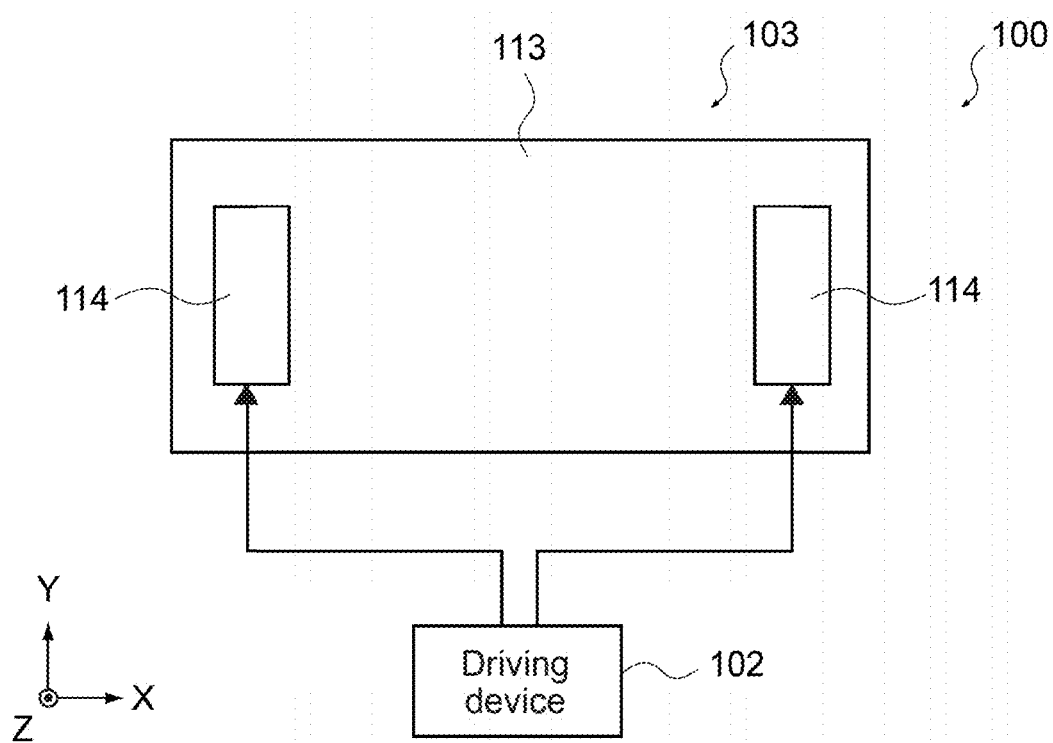
FIG. 12 is a schematic diagram of the tactile sensation providing apparatus according to the embodiment of the present disclosure.

The tactile sensation providing apparatus 100 may include a vibration generating device that allows the user to obtain a tactile sensation by direct contact, in place of the spatial vibration generating device 101. FIG. 12 is a schematic diagram of the tactile sensation providing apparatus 100 including a vibration generating device 103. As shown in the figure, the vibration generating device 103 includes a vibrating member 113 and piezoelectric elements 114.

Figure 13:
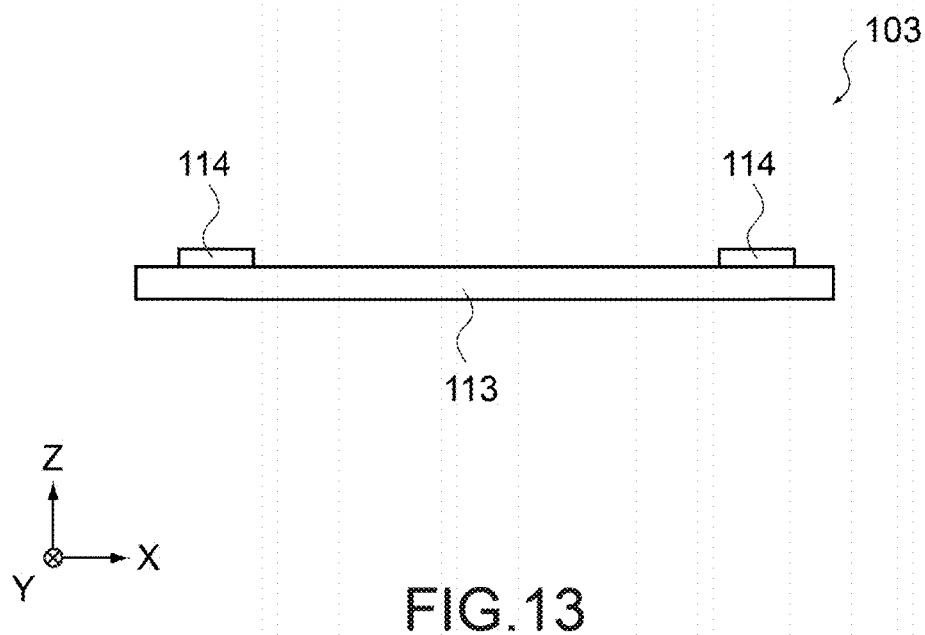
FIG. 13 is a schematic diagram of a vibration generating device of the tactile sensation providing apparatus.

The vibrating member 113 is a member that vibrates by the piezoelectric elements 114. FIG. 13 is a side view of the vibrating member 113. The vibrating member 113 can be a plate-shaped member formed from a material such as glass or plastic, and is, for example, a liquid crystal panel or a housing of an electronic device. The shape and size of the vibrating member 113 are not particularly limited.

The piezoelectric elements 114 are bonded to the vibrating member 113 to generate vibrations. The piezoelectric elements 114 each includes a positive electrode, a negative electrode, and a piezoelectric material layer. When a voltage is applied between the positive electrode and the negative electrode, the piezoelectric material layer is deformed due to the reverse piezoelectric effect, and vibrations are generated. The piezoelectric elements 114 may each have a laminated structure in which the positive electrodes and the negative electrodes are alternately laminated with the piezoelectric material layers each interposed therebetween or may have another structure.

As shown in FIG. 13, the piezoelectric elements 114 may be disposed one by one at both ends of the vibrating member 113 in the long-side direction (x direction). In addition, the number of piezoelectric elements 114 is not limited to two, and one or three or more piezoelectric elements 114 may be disposed. The piezoelectric elements 114 can be joined to the vibrating member 113 by bonding or the like.

The driving device 102 is connected to the positive electrodes and the negative electrodes of the piezoelectric elements 114 and outputs a driving signal waveform between the positive electrodes and the negative electrodes. The tactile sensation providing apparatus 100 may thus include the vibration generating device 103. When touching the vibration generating device 103, the user can perceive various tactile sensations, which will be described later, through vibrations generated by the piezoelectric elements 114.

[Frequency Ratio of First Modulated Wave and Second Modulated Wave]

As described above, the driving device 102 uses the first low-frequency wave as a first modulated wave to modulate the amplitude of the second low-frequency wave with the first modulated wave, thus generating a second modulated wave. Further, the driving device 102 modulates the high-frequency wave with the second modulated wave by amplitude modulation or frequency modulation, to generate a driving signal wave.

The following Table 1 is a table showing tactile sensations that can be provided to the user by the first low-frequency wave, the second low-frequency wave, and the high-frequency wave. The driving device 102 is capable of providing various tactile sensations to the user touching the vibrating member 113 by supplying the driving signals generated from the first low-frequency wave, the second low-frequency wave, and the high-frequency wave to the piezoelectric elements 114 of the vibration generating device 103 as described above.

TABLE 1

| Frequency region | High-frequency wave | Second low-frequency wave | First low-frequency wave |
|---|---|---|---|
| Effect on receptors | Resonance of vibrating member | Pacinian corpuscle | Meissner's corpuscle, Merkel region |
| Mechanism | Levitation technique | Tactile sensation by low frequency | Tactile sensation by low frequency |
| Frequency range | 20~100 kHz | 100~300 kHz | 1~100 kHz |
| Degree of modulation | 100% | 100% | 100% |
| Tactile sensation | Smooth (floating sensation) | Ticking sensation | Bump (pressure sensation expression) |

Here, the driving device 102 can use the ratio of the frequency of the second low-frequency wave to the frequency of the first low-frequency wave (hereinafter, referred to as frequency ratio) as a predetermined ratio. Specifically, the driving device 102 may set the frequency ratio to 100, 10, 5, 4, or 2.

The following Table 2 is a table showing the frequencies of the second low-frequency wave and the first low-frequency wave and the frequency ratio. As shown in this table, in the "frequency ratio 100", if the frequency of the second low-frequency wave is 100 Hz, the frequency of the first low-frequency wave can be 1 Hz, if the frequency of the second low-frequency wave is 160 Hz, the frequency of the first low-frequency wave can be 1.6 Hz, and if the frequency of the second low-frequency wave is 200 Hz, the frequency of the first low-frequency wave can be 2 Hz, for example.

In addition, in the "frequency ratio 10", if the frequency of the second low-frequency wave is 100 Hz, the frequency of the first low-frequency wave can be 10 Hz, if the frequency of the second low-frequency wave is 160 Hz, the frequency of the first low-frequency wave can be 16 Hz, and if the frequency of the second low-frequency wave is 200 Hz, the frequency of the first low-frequency wave can be 20 Hz, for example. Hereinafter, similarly, the driving device 102 is capable of setting the frequencies of the first low-frequency wave and the second low-frequency wave to have the frequency ratio shown in Table 2.

The driving device 102 modulates the amplitude of the second low-frequency wave having the frequency ratio shown in Table 2 with the first modulated wave to generate the second modulated wave, and modulates the high-frequency wave with the second modulated wave to generate the driving signal wave. When the driving device 102 supplies the driving signal wave to the piezoelectric elements 114 of the vibration generating device 103, various tactile sensations can be provided to the user touching the vibrating member 113.

Here, the tactile sensation providing apparatus 100 is capable of controlling the tactile sensation to be provided to the user according to the frequency ratio. Specifically, as shown in Table 2, when the frequency ratio is 100, a "tactile sensation A" can be provided to the user. The "tactile sensation A" is a tactile sensation that is a pushing sensation having softness.

In addition, when the frequency ratio is 10, a "tactile sensation B" can be provided to the user. The "tactile sensation B" is a tactile sensation that is a pressure sensation such as "ticktick" or "tap-tap". When the frequency ratio is 5, a "tactile sensation C" can be provided to the user. The "tactile sensation C" is a tactile sensation that is a numbness sensation such as itchy. When the frequency ratio is 4, a "tactile sensation D" can be provided to the user. The "tactile

TABLE 2

| Second low-frequency wave Frequency [Hz] | First low-frequency wave Frequency ratio, Frequency [Hz] | | | | |
|---|---|---|---|---|---|
| | 100 | 10 | 5 | 4 | 2 |
| 100 | 1 | 10 | 20 | 25 | 50 |
| 160 | 1.6 | 16 | 32 | 40 | 80 |
| 200 | 2 | 20 | 40 | 50 | 100 |
| 250 | 2.5 | 25 | 50 | 62.5 | 125 |
| 300 | 3 | 30 | 60 | 75 | 150 |
| Tactile sensation | Tactile sensation A | Tactile sensation B | Tactile sensation C | Tactile sensation D | Tactile sensation E | sensation D" is a delicate, pricking tactile sensation. When the frequency ratio is 2, a "tactile sensation E" can be provided to the user. The "tactile sensation E" is a tactile sensation that emphasizes a vibratory sensation at the time of squeezing (levitation phenomenon using vibrations).

In such a manner, the tactile sensation providing apparatus 100 is capable of providing various tactile sensations to the user according to the frequency ratio.

[Waveform of Driving Signal Wave]

Figure 14:
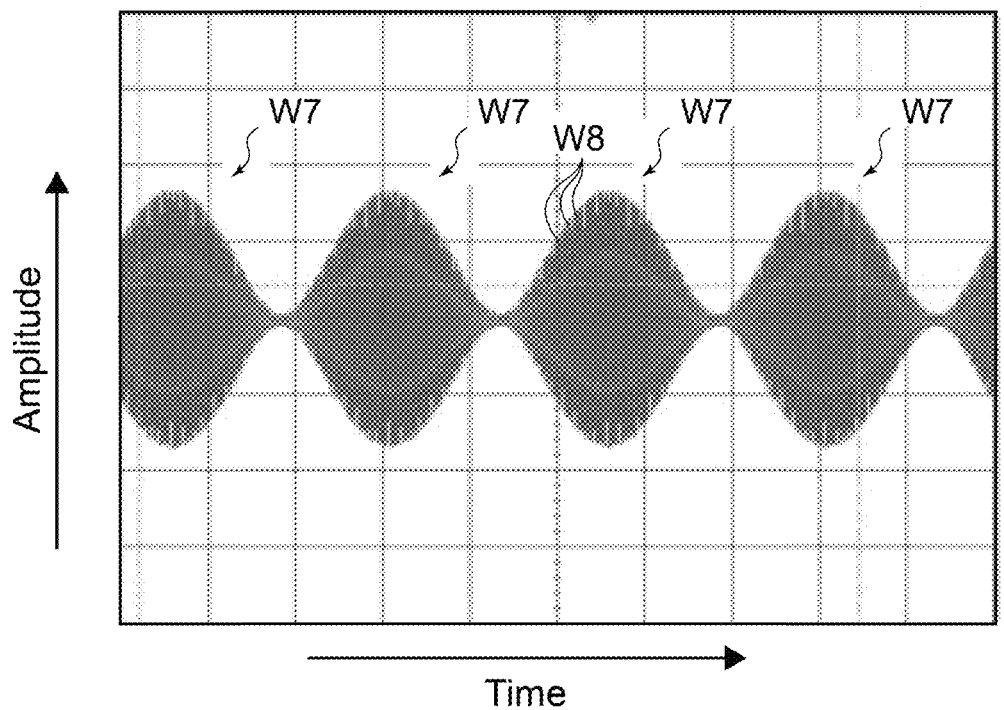
FIG. 14 is a schematic diagram showing a waveform of a driving signal wave (25 kHz+200 Hz) generated by the driving device of the tactile sensation providing apparatus.

FIGS. 14 to 18 are examples of the driving signal waves having different frequency ratios. FIG. 14 shows, as a comparison, a waveform obtained by modulating the amplitude of a high-frequency wave having a frequency of 25 kHz with a low-frequency wave having a frequency of 200 Hz. In the figure, a wave having a smaller wavelength, which is indicated by W8, is an amplitude-modulated high-frequency wave, and a wave having a larger wavelength, which is indicated by W7, is a second modulated wave formed by the change in amplitude of the high-frequency wave W8. In other words, the driving signal wave shown in FIG. 14 is an amplitude-modulated wave in which the high-frequency wave W8 is a carrier wave and the second modulated wave W7 is a modulated wave.

Figure 15:
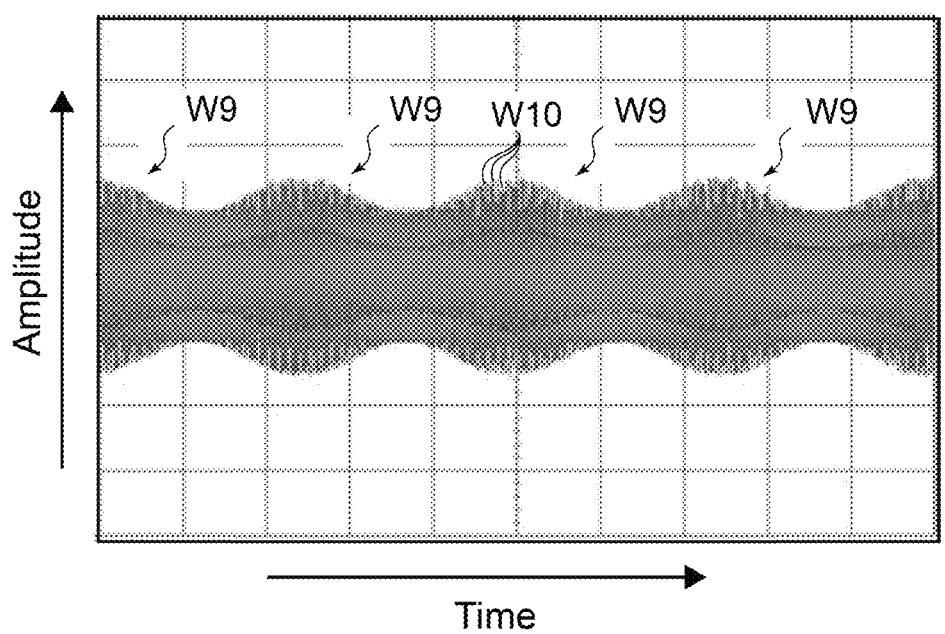
FIG. 15 is a schematic diagram showing a waveform of a driving signal wave (25 kHz+200 Hz+2 Hz) generated by the driving device of the tactile sensation providing apparatus.

FIG. 15 is a waveform obtained by modulating the amplitude of a high-frequency wave having a frequency of 25 kHz with a second modulated wave, and the second modulated wave has a waveform obtained by modulating the amplitude of a second low-frequency wave having a frequency of 200 Hz with a first modulated wave having a frequency of 2 Hz. In the figure, a wave having a smaller wavelength, which is indicated by W10, is an amplitude-modulated high-frequency wave, and a wave having a larger wavelength, which is indicated by W9, is a second modulated wave formed by the change in amplitude of the high-frequency wave W10. In other words, the driving signal wave shown in FIG. 15 is an amplitude-modulated wave in which the high-frequency wave W10 is a carrier wave and the second modulated wave W9 is a modulated wave. In this driving signal wave, the "tactile sensation A" can be provided.

Figure 16:
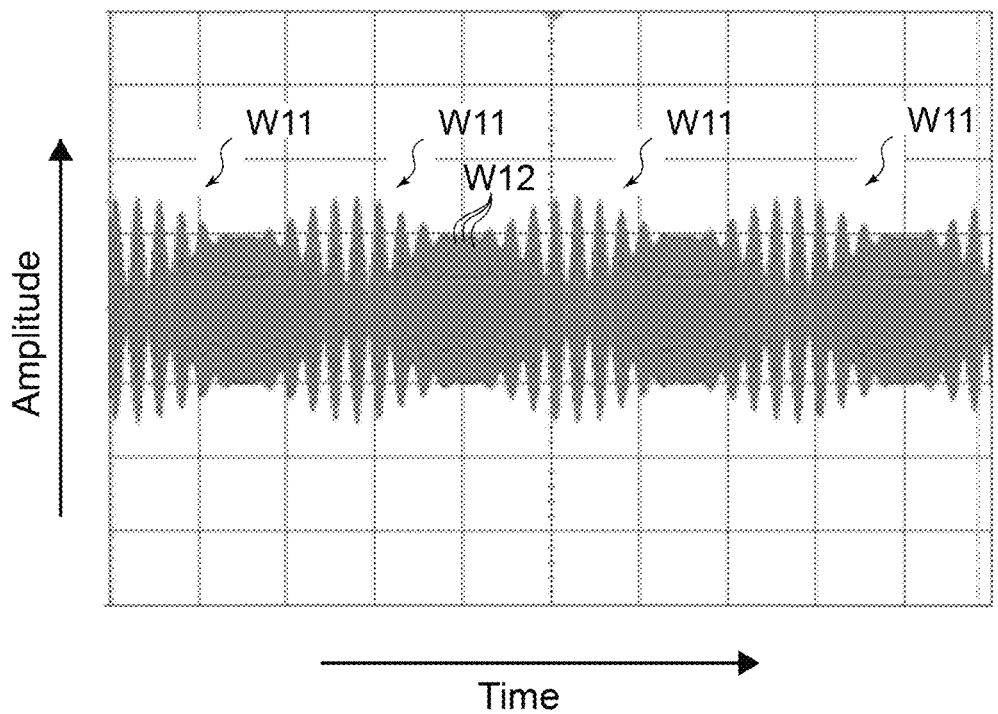
FIG. 16 is a schematic diagram showing a waveform of a driving signal wave (25 kHz+200 Hz+20 Hz) generated by the driving device of the tactile sensation providing apparatus.

FIG. 16 is a waveform obtained by modulating the amplitude of a high-frequency wave having a frequency of 25 kHz with a second modulated wave, and the second modulated wave has a waveform obtained by modulating the amplitude of a second low-frequency wave having a frequency of 200 Hz with a first modulated wave having a frequency of 20 Hz. In the figure, a wave having a smaller wavelength, which is indicated by W12, is an amplitude-modulated high-frequency wave, and a wave having a larger wavelength, which is indicated by W11, is a second modulated wave formed by the change in amplitude of the high-frequency wave W12. In other words, the driving signal wave shown in FIG. 16 is an amplitude-modulated wave in which the high-frequency wave W12 is a carrier wave and the second modulated wave W11 is a modulated wave. In this driving signal wave, the "tactile sensation B" can be provided.

Figure 17:
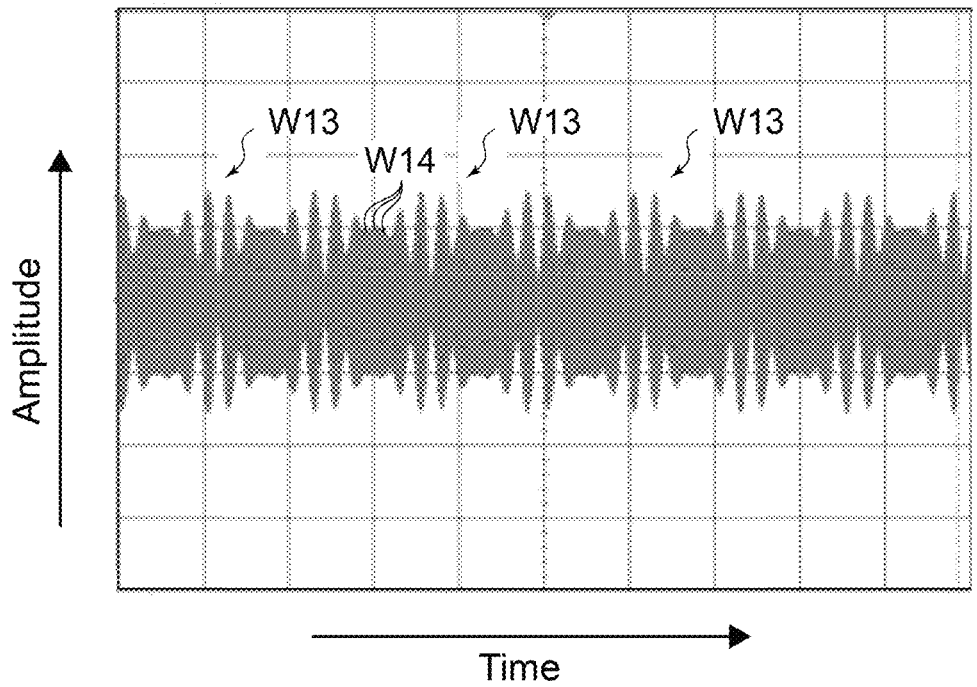
FIG. 17 is a schematic diagram showing a waveform of a driving signal wave (25 kHz+200 Hz+40 Hz) generated by the driving device of the tactile sensation providing apparatus.

FIG. 17 is a waveform obtained by modulating the amplitude of a high-frequency wave having a frequency of 25 kHz with a second modulated wave, and the second modulated wave has a waveform obtained by modulating the amplitude of a second low-frequency wave having a frequency of 200 Hz with a first modulated wave having a frequency of 40 Hz. In the figure, a wave having a smaller wavelength, which is indicated by W14, is an amplitude-modulated high-frequency wave, and a wave having a larger wavelength, which is indicated by W13, is a second modulated wave formed by the change in amplitude of the high-frequency wave W14. In other words, the driving signal wave shown in FIG. 17 is an amplitude-modulated wave in which the high-frequency wave W14 is a carrier wave and the second modulated wave W13 is a modulated wave. In this driving signal wave, the "tactile sensation C" can be provided.

Figure 18:
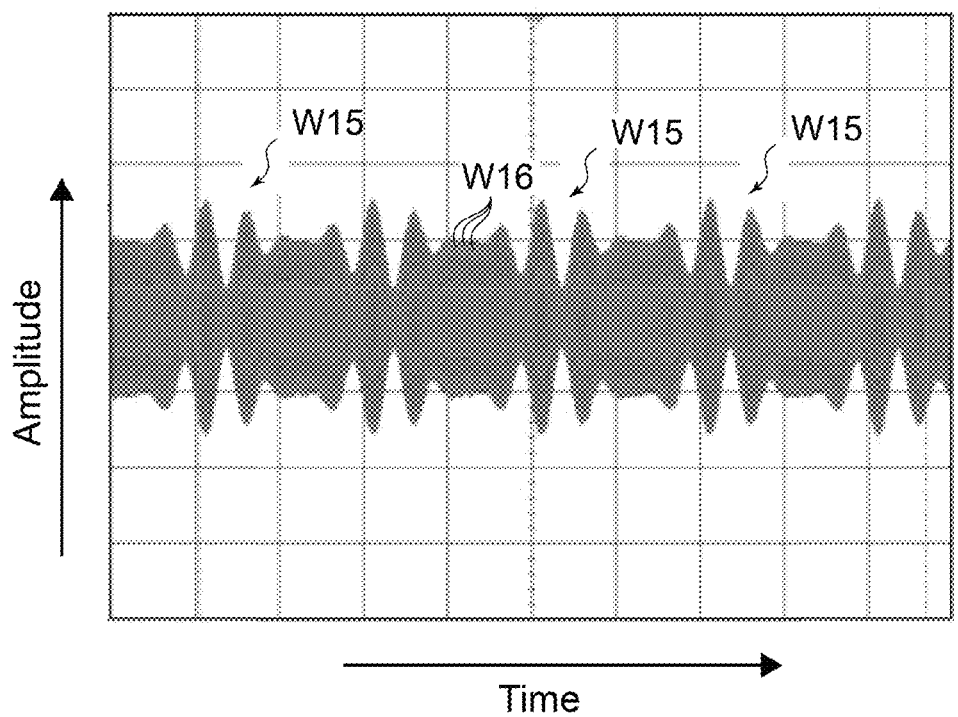
FIG. 18 is a schematic diagram showing a waveform of a driving signal wave (25 kHz+200 Hz+50 Hz) generated by the driving device of the tactile sensation providing apparatus.

FIG. 18 is a waveform obtained by modulating the amplitude of a high-frequency wave having a frequency of 25 kHz with a second modulated wave, and the second modulated wave has a waveform obtained by modulating the amplitude of a second low-frequency wave having a frequency of 200 Hz with a first modulated wave having a frequency of 50 Hz. In the figure, a wave having a smaller wavelength, which is indicated by W16, is an amplitude-modulated high-frequency wave, and a wave having a larger wavelength, which is indicated by W15, is a second modulated wave formed by the change in amplitude of the high-frequency wave W16. In other words, the driving signal wave shown in FIG. 18 is an amplitude-modulated wave in which the high-frequency wave W16 is a carrier wave and the second modulated wave W15 is a modulated wave. In this driving signal wave, the "tactile sensation D" can be provided.

Example

The driving device according to the above embodiment generated a driving signal wave and supplied the driving signal wave to the piezoelectric elements of the vibration generating device (see FIG. 12). A finger was brought into contact with the vibrating member, and a tactile sensation due to the vibrations of the vibrating member was observed. The driving signal wave was generated by modulating the high-frequency wave with the second modulated wave as described above. The second modulated wave is obtained by using the first low-frequency wave as the first modulated wave to modulate the amplitude of the second low-frequency wave with the first modulated wave.

Figure 19:
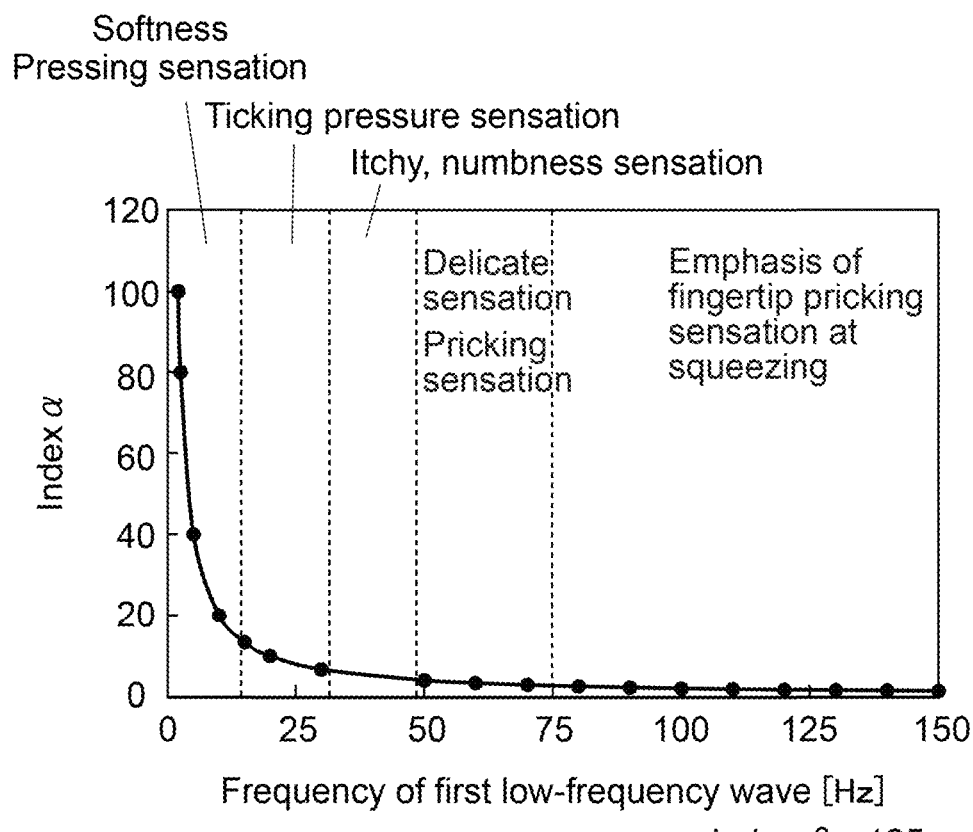
FIG. 19 is a graph, in which an index $\alpha$ is plotted with respect to the frequency of the first low-frequency wave (index $\beta$=125), according to Example of the present disclosure.

Table 3 below is a table showing the tactile sensations due to vibrations generated when the frequency of the high-frequency wave is 25 kHz, the frequency of the second low-frequency wave is 200 Hz, and the frequency of the first low-frequency wave is changed. Table 3 shows an index $\alpha$, which is (the frequency of the second low-frequency wave/the frequency of the first low-frequency wave), equal to the frequency ratio in the above embodiment. An index $\beta$ is (the frequency of the high-frequency wave/the frequency of the second low-frequency wave). FIG. 19 is a graph in which the index $\alpha$ shown in Table 3 is plotted with respect to the frequency of the first low-frequency wave.

TABLE 3

| Index $\beta$ 125 | | | | |
|---|---|---|---|---|
| High-frequency wave [Hz] | Second low-frequency wave [Hz] | First low-frequency wave [Hz] | Index $\alpha$ | Tactile sensation |
| 25000 | 200 | 2 | 100 | Pressing expression |
| 25000 | 200 | 2.5 | 80.0 | Pressing expression |
| 25000 | 200 | 5 | 40.0 | Pressing expression |

TABLE 3-continued

| Index β 125 High-frequency wave [Hz] | Second low-frequency wave [Hz] | First low-frequency wave [Hz] | Index α | Tactile sensation |
|---|---|---|---|---|
| 25000 | 200 | 10 | 20.0 | Pressing expression |
| 25000 | 200 | 15 | 13.3 | Pressing expression |
| 25000 | 200 | 20 | 10.0 | Pressure sensation expression (Bump) |
| 25000 | 200 | 30 | 6.7 | Pressure sensation expression (Bump) |
| 25000 | 200 | 50 | 4.0 | Pressure sensation expression (Bump) |
| 25000 | 200 | 60 | 3.3 | Delicate expression (numbness sensation) |
| 25000 | 200 | 70 | 2.9 | Delicate expression (numbness sensation) |
| 25000 | 200 | 80 | 2.5 | Delicate expression (numbness sensation) |
| 25000 | 200 | 90 | 2.2 | Emphasis at squeezing (pricking sensation) |
| 25000 | 200 | 100 | 2.0 | Emphasis at squeezing (pricking sensation) |
| 25000 | 200 | 110 | 1.8 | Emphasis at squeezing (pricking sensation) |
| 25000 | 200 | 120 | 1.7 | Emphasis at squeezing (pricking sensation) |
| 25000 | 200 | 130 | 1.5 | Emphasis at squeezing (pricking sensation) |
| 25000 | 200 | 140 | 1.4 | Emphasis at squeezing (pricking sensation) |
| 25000 | 200 | 150 | 1.3 | Emphasis at squeezing (pricking sensation) |

Figure 20:
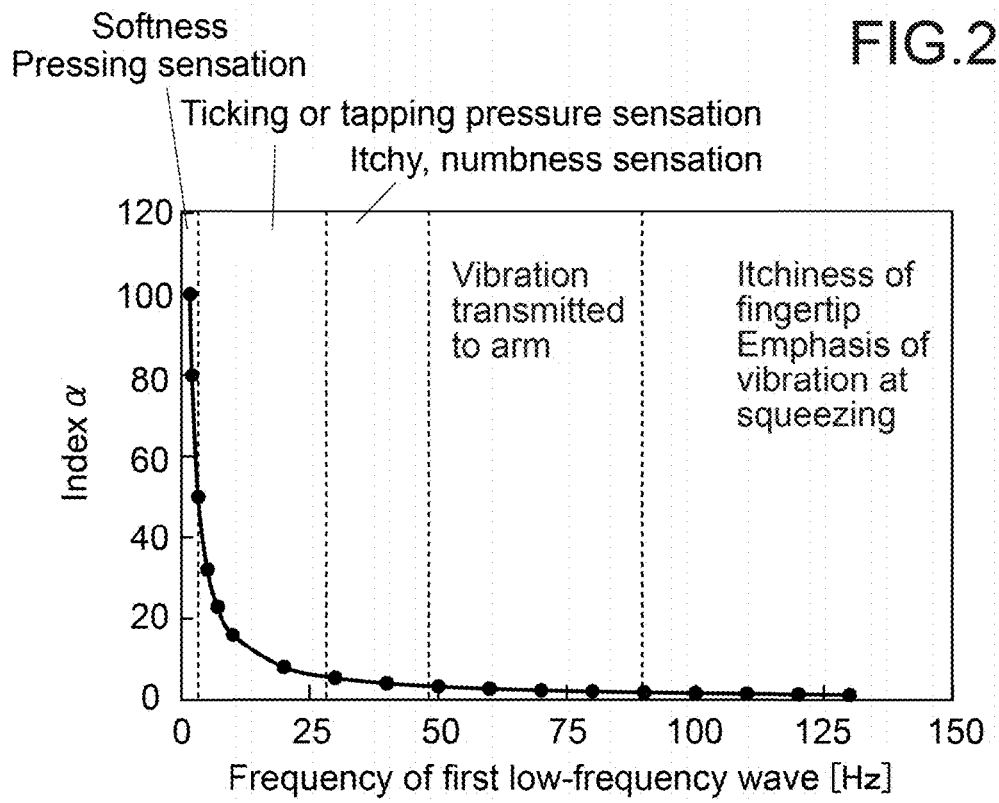
FIG. 20 is a graph, in which an index $\alpha$ is plotted with respect to the frequency of the first low-frequency wave (index $\beta$=156), according to Example of the present disclosure.

Table 4 below is a table showing the tactile sensations due to vibrations generated when the frequency of the high-frequency wave is 25 kHz, the frequency of the second low-frequency wave is 160 Hz, and the frequency of the first low-frequency wave is changed. Table 4 shows an index α, which is (the frequency of the second low-frequency wave/the frequency of the first low-frequency wave), and an index β is (the frequency of the high-frequency wave/the frequency of the second low-frequency wave). FIG. 20 is a graph in which the index α shown in Table 4 is plotted with respect to the frequency of the first low-frequency wave.

Figure 21:
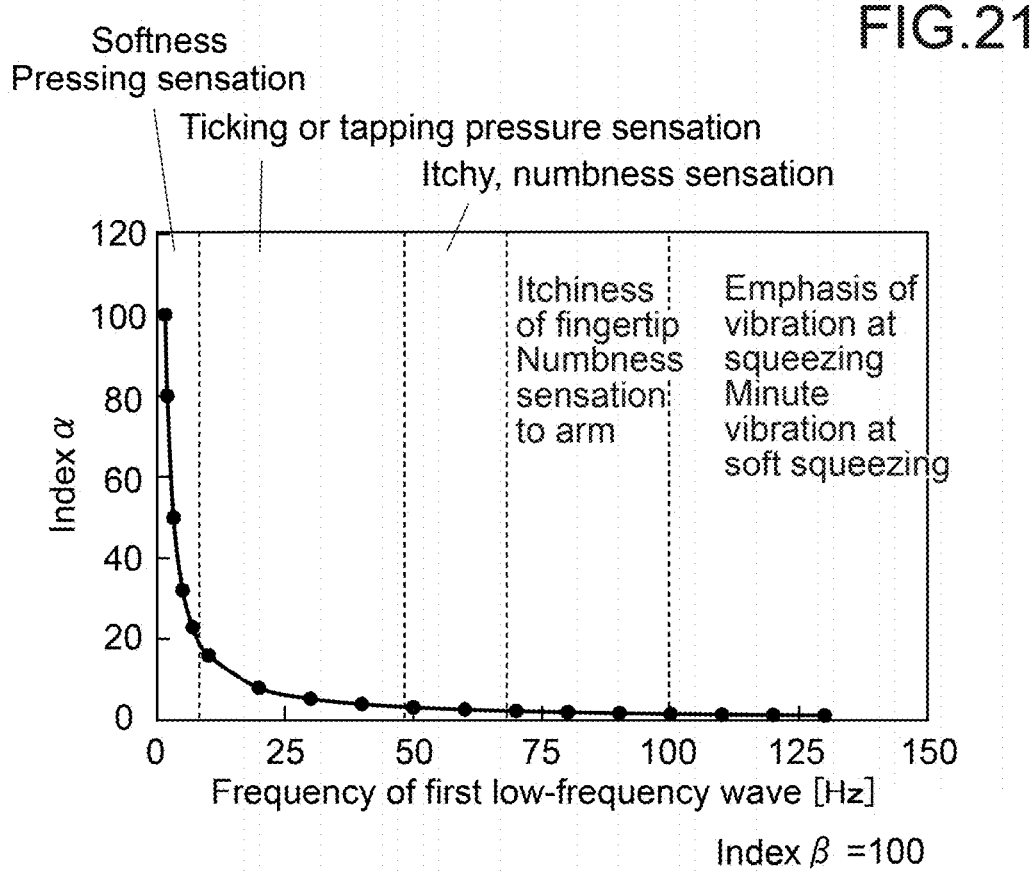
FIG. 21 is a graph, in which an index $\alpha$ is plotted with respect to the frequency of the first low-frequency wave (index $\beta$=100), according to Example of the present disclosure.

Table 5 below is a table showing the tactile sensations due to vibrations generated when the frequency of the high-frequency wave is 25 kHz, the frequency of the second low-frequency wave is 250 Hz, and the frequency of the first low-frequency wave is changed. Table 5 shows an index α, which is (the frequency of the second low-frequency wave/the frequency of the first low-frequency wave), equal to the frequency ratio in the embodiment. An index β is (the frequency of the high-frequency wave/the frequency of the second low-frequency wave). FIG. 21 is a graph in which the index α shown in Table 5 is plotted with respect to the frequency of the first low-frequency wave.

TABLE 4

| Index β 156 High-frequency wave [Hz] | Second low-frequency wave [Hz] | First low-frequency wave [Hz] | Index α | Tactile sensation |
|---|---|---|---|---|
| 25000 | 160 | 1.6 | 100 | Pressing expression |
| 25000 | 160 | 2 | 80.0 | Pressing expression |
| 25000 | 160 | 3.2 | 50.0 | Pressing expression |
| 25000 | 160 | 5 | 32.0 | Pressing expression |
| 25000 | 160 | 7 | 22.9 | Pressure sensation expression (Bump) |
| 25000 | 160 | 10 | 16.0 | Pressure sensation expression (Bump) |
| 25000 | 160 | 20 | 8.0 | Pressure sensation expression (Bump) |
| 25000 | 160 | 30 | 5.3 | Delicate expression (numbness sensation) |
| 25000 | 160 | 40 | 4.0 | Delicate expression (numbness sensation) |
| 25000 | 160 | 50 | 3.2 | Delicate expression (numbness sensation) |
| 25000 | 160 | 60 | 2.7 | Delicate expression (numbness sensation) |
| 25000 | 160 | 70 | 2.3 | Delicate expression (numbness sensation) |
| 25000 | 160 | 80 | 2.0 | Delicate expression (numbness sensation) |
| 25000 | 160 | 90 | 1.8 | Delicate expression (numbness sensation) |
| 25000 | 160 | 100 | 1.6 | Emphasis at squeezing (pricking sensation) |
| 25000 | 160 | 110 | 1.5 | Emphasis at squeezing (pricking sensation) |
| 25000 | 160 | 120 | 1.3 | Emphasis at squeezing (pricking sensation) |
| 25000 | 160 | 130 | 1.2 | Emphasis at squeezing (pricking sensation) |

TABLE 5

| Index β 100 High-frequency wave [Hz] | Second low-frequency wave [Hz] | First low-frequency wave [Hz] | Index α | Tactile sensation |
|---|---|---|---|---|
| 25000 | 250 | 2.5 | 100 | Pressing expression |
| 25000 | 250 | 5 | 50.0 | Pressing expression |
| 25000 | 250 | 7.5 | 33.3 | Pressing expression |
| 25000 | 250 | 10 | 25.0 | Pressing expression |
| 25000 | 250 | 15 | 16.7 | Pressure sensation expression (Bump) |
| 25000 | 250 | 20 | 12.5 | Pressure sensation expression (Bump) |
| 25000 | 250 | 30 | 8.3 | Pressure sensation expression (Bump) |
| 25000 | 250 | 50 | 5.0 | Delicate expression (numbness sensation) |
| 25000 | 250 | 60 | 4.2 | Delicate expression (numbness sensation) |
| 25000 | 250 | 70 | 3.6 | Delicate expression (numbness sensation) |
| 25000 | 250 | 80 | 3.1 | Delicate expression (numbness sensation) |
| 25000 | 250 | 90 | 2.8 | Delicate expression (numbness sensation) |
| 25000 | 250 | 100 | 2.5 | Emphasis at squeezing (pricking sensation) |
| 25000 | 250 | 110 | 2.3 | Emphasis at squeezing (pricking sensation) |
| 25000 | 250 | 120 | 2.1 | Emphasis at squeezing (pricking sensation) |
| 25000 | 250 | 130 | 1.9 | Emphasis at squeezing (pricking sensation) |
| 25000 | 250 | 140 | 1.8 | Emphasis at squeezing (pricking sensation) |
| 25000 | 250 | 150 | 1.7 | Emphasis at squeezing (pricking sensation) |

As shown in FIGS. 19 to 21, different tactile sensations were obtained depending on the index α. In addition, the tendency of the tactile sensations corresponding to the index α was similar even if the index β was different. Therefore, it is possible to control the tactile sensations to be provided to the user by using the index α.

While the embodiment of the present disclosure has been described, the present disclosure is not limited to the embodiment described above, and it should be appreciated that the present disclosure may be variously modified.

What is claimed is:

1. A driving device that generates a plurality of driving signals and outputs the driving signals to a piezoelectric element, each driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave, wherein each driving signal has a frequency ratio of the frequency of the second low-frequency wave to the frequency of the first low-frequency wave,
wherein the plurality of driving signals is comprised of different driving signals having different frequency ratios.

2. The driving device according to claim 1, wherein the modulation of the high-frequency wave with the second modulated wave includes an amplitude modulation.

3. The driving device according to claim 1, wherein the modulation of the high-frequency wave with the second modulated wave includes a frequency modulation.

4. The driving device according to claim 1, wherein the frequency ratio of the frequency of the second low-frequency wave to the frequency of the first low-frequency wave is 100, 10, 5, 4, or 2.

5. A tactile sensation providing apparatus, comprising:
a spatial vibration generating device that includes transducers each including a piezoelectric element and arranged to cause ultrasonic waves to converge to a point in a space; and
a driving device that generates a plurality of driving signals and outputs the driving signals to the piezoelectric element, each driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave, wherein each driving signal has a frequency ratio of the frequency of the second low-frequency wave to the frequency of the first low-frequency wave,
wherein the plurality of driving signals is comprised of different driving signals having different frequency ratios.

6. A tactile sensation providing apparatus, comprising:
a vibration generating device that includes
a vibrating member, and
a piezoelectric element bonded to the vibrating member; and
a driving device that generates a plurality of driving signals and outputs the driving signals to a piezoelectric element, each driving signal having a waveform obtained by using, as a first modulated wave, a first low-frequency wave having a frequency of 1 Hz or more and less than 100 Hz, using, as a second modulated wave, a waveform obtained by modulating an amplitude of a second low-frequency wave having a frequency of 100 Hz or more and 300 Hz or less with the first modulated wave, and modulating a high-frequency wave having a frequency of 20 kHz or more and 100 kHz or less with the second modulated wave, wherein each driving signal has a frequency ratio of the frequency of the second low-frequency wave to the frequency of the first low-frequency wave, wherein the plurality of driving signals is comprised of different driving signals having different frequency ratios.

7. A driving method, comprising:

setting a frequency ratio of a frequency of a second low-frequency wave to a frequency of a first low-frequency wave at a predetermined value, wherein the frequency of the first low-frequency wave is 1 Hz or more and less than 100 Hz, the frequency of the second low-frequency wave is 100 Hz or more and 300 Hz or less;

generating a driving signal, the driving signal having a waveform obtained by using, as a first modulated wave, the first low-frequency wave, using, as a second modulated wave, a waveform obtained by modulating an amplitude of the second low-frequency wave with the first modulated wave, and modulating a high-frequency wave having a frequency of 20 kHz or more and 100 kHz or less with the second modulated wave; and outputting the driving signal to a piezoelectric element.

8. The driving method according to claim 7, wherein the modulating the high-frequency wave with the second modulated wave includes an amplitude modulation.

9. The driving method according to claim 7, wherein the modulating the high-frequency wave with the second modulated wave includes a frequency modulation.

10. The driving method according to claim 7, wherein the frequency ratio of the frequency of the second low-frequency wave to the frequency of the first low-frequency wave is 100, 10, 5, 4, or 2.

11. A driving method, comprising:

setting a frequency of a first low-frequency wave to 1 Hz or more and less than 100 Hz;

setting a frequency of a second low-frequency wave to 100 Hz or more and 300 Hz or less;

setting a frequency of a high-frequency wave to 20 kHz or more and 100 kHz or less;

generating a second modulated wave having a waveform obtained by using the first low-frequency wave as a first modulated wave and modulating an amplitude of the second low-frequency wave with the first modulated wave;

generating a driving signal having a waveform obtained by modulating the high-frequency wave with the second modulated wave; and outputting the driving signal to a piezoelectric element, wherein setting the frequency of the second low-frequency wave includes setting a frequency ratio of the frequency of the second low-frequency wave to the frequency of the first low-frequency wave at a predetermined value.

12. The driving method according to claim 11, wherein the ratio of the frequency of the second low-frequency wave to the frequency of the first low-frequency wave is 100, 10, 5, 4, or 2.

* * * * *